US012751310B2

(12) United States Patent
Morita et al.

(10) Patent No.: US 12,751,310 B2
(45) Date of Patent: Sep. 29, 2026

(54) DICING DIE ATTACH FILM AND METHOD OF PRODUCING THE SAME, AND SEMICONDUCTOR PACKAGE AND METHOD OF PRODUCING THE SAME

(71) Applicant: FURUKAWA ELECTRIC CO., LTD., Tokyo (JP)

(72) Inventors: Minoru Morita, Tokyo (JP); Yota Otani, Tokyo (JP); Hiromitsu Maruyama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 910 days.

(21) Appl. No.: 17/826,793

(22) Filed: May 27, 2022

(65) Prior Publication Data

US 2022/0310547 A1 Sep. 29, 2022

Related U.S. Application Data

(63) Continuation of application No. PCT/JP2021/047140, filed on Dec. 20, 2021.

(30) Foreign Application Priority Data

Mar. 26, 2021 (JP) ................................ 2021-052762

(51) Int. Cl.
*H10W 72/00* (2026.01)
*H10W 72/30* (2026.01)
(Continued)

(52) U.S. Cl.
CPC ....... *H10W 72/0198* (2026.01); *H10W 90/00* (2026.01); *H10W 72/01357* (2026.01);
(Continued)

(58) Field of Classification Search
CPC ... H01L 2225/0651; H01L 2225/06524; H01L 2225/06562; H01L 2224/27515;
(Continued)

(56) References Cited

U.S. PATENT DOCUMENTS

2009/0162650 A1 6/2009 Hong et al.
2021/0292617 A1 9/2021 Morita

FOREIGN PATENT DOCUMENTS

JP 2008-103700 A 5/2008
JP 2010-62553 A 3/2010
(Continued)

OTHER PUBLICATIONS

International Search Report for PCT/JP2021/047140 (PCT/ISA/210) mailed on Feb. 1, 2022.
(Continued)

*Primary Examiner* — Leonard Chang
*Assistant Examiner* — Stanetta D Isaac
(74) *Attorney, Agent, or Firm* — Birch, Stewart, Kolasch & Birch, LLP

(57) ABSTRACT

A dicing die attach film containing a dicing film and a die attach film stacked on the dicing film, wherein the die attach film contains an organic solvent having a boiling point of 100° C. or more and less than 150° C. and a vapor pressure of 50 mmHg or less, and wherein an amount of the organic solvent in the die attach film satisfies the following (a):

(a) when 1.0 g of the die attach film is immersed in 10.0 mL of acetone at 4° C. for 24 hours, an amount of the organic solvent extracted into the acetone is 800 μg or less.

8 Claims, 2 Drawing Sheets

(51) Int. Cl.
*H10W 90/00* (2026.01)
*H10W 90/20* (2026.01)
*H10W 90/24* (2026.01)

(52) U.S. Cl.
CPC ............................ *H10W 72/01361* (2026.01); *H10W 72/07304* (2026.01); *H10W 72/07332* (2026.01); *H10W 72/07338* (2026.01); *H10W 72/325* (2026.01); *H10W 72/352* (2026.01); *H10W 72/354* (2026.01); *H10W 72/884* (2026.01); *H10W 90/20* (2026.01); *H10W 90/24* (2026.01); *H10W 90/732* (2026.01); *H10W 90/734* (2026.01); *H10W 90/754* (2026.01)

(58) Field of Classification Search
CPC ... H01L 2224/27849; H01L 2224/2929; H01L 2224/29324; H01L 2224/32145; H01L 2224/32225; H01L 2224/48225; H01L 2224/73265; H01L 2224/83002; H01L 2224/83204; H01L 2224/83874; H01L 2224/27003; H01L 2224/48091; H01L 2224/83191; H01L 2224/83101; H01L 2224/83203; H01L 2224/8385; H01L 2224/83862; H01L 2224/8592; H01L 2224/92247; H01L 25/0657; H01L 25/50; H01L 24/29; H01L 24/27; H01L 24/32; H01L 24/83; H01L 24/94; H01L 24/48; H01L 24/73; H01L 24/92; H01L 24/50; H01L 24/85; H01L 24/28; H01L 24/31; H01L 24/80; C09J 7/38; C09J 11/06; C09J 163/00; C09J 2301/208; C09J 2301/312; H10W 90/00; H10W 90/20; H10W 90/24; H10W 90/732; H10W 90/734; H10W 90/754; H10W 90/26; H10W 72/0198; H10W 72/01357; H10W 72/01361; H10W 72/07304; H10W 72/07332; H10W 72/07338; H10W 72/325; H10W 72/352; H10W 72/354; H10W 72/01304; H10W 72/01515; H10W 72/073; H10W 72/07337; H10W 72/075; H10W 72/701; H10P 72/7404; H10P 72/7416; H10P 72/7438; H10P 72/7402
See application file for complete search history.

(56) References Cited

FOREIGN PATENT DOCUMENTS

| | | | |
|---|---|---|---|
| JP | 2011-82480 | A | 4/2011 |
| JP | 2011-184603 | A | 9/2011 |
| WO | WO 2017/158994 | A1 | 9/2017 |
| WO | WO 2021/033368 | A1 | 2/2021 |

OTHER PUBLICATIONS

Notice of Reasons for Refusal for Japanese patent application No. 2021-052762 mailed on May 25, 2021.
Written Opinion of the International Searching Authority for PCT/JP2021/047140 (PCT/ISA/237) mailed on Feb. 1, 2022.
Korean Office Action dated Sep. 13, 2023 for corresponding Application No. 10-2022-7022626 with an English translation.
Singaporean Written Opinion dated Sep. 19, 2023 for corresponding Application No. 11202205337V.
Chinese Office Action and Search Report for Chinese Application No. 202180009176.1, dated Apr. 3, 2025, with English translation.

DICING DIE ATTACH FILM AND METHOD OF PRODUCING THE SAME, AND SEMICONDUCTOR PACKAGE AND METHOD OF PRODUCING THE SAME

CROSS-REFERENCE TO RELATED APPLICATIONS

This application is a Continuation of PCT International Application No. PCT/JP2021/047140 filed on Dec. 20, 2021, which claims priority under 35 U.S.C. § 119 (a) to Japanese Patent Application No. 2021-052762 filed in Japan on Mar. 26, 2021. Each of the above applications is hereby expressly incorporated by reference, in its entirely, into the present application.

FIELD OF THE INVENTION

The present invention relates to a dicing die attach film and a method of producing the same, and a semiconductor package and a method of producing the same.

BACKGROUND OF THE INVENTION

Stacked MCPs (Multi Chip Package) in which semiconductor chips are multistacked have recently been widely spread. Such stacked MCPs are mounted on memory packages for mobile phones or portable audio devices. Further, along with multi-functionality of mobile phones and the like, high densification and high integration of the package have also been advanced. Along with such advance, multi-stacking of the semiconductor chips has been advanced.

A die attach film (film-shaped bonding agent) is used for bonding between a circuit board and a semiconductor chip and bonding between semiconductor chips during production of such a memory package, and a die attach film is used which hardly causes contamination in other members such as semiconductor chips and wire pads due to resin flow, resin crawling, and the like.

One of die attach film surfaces of a die attach film is usually attached to a semiconductor wafer; the other surface is tightly adhered to a dicing film; the semiconductor wafer and the die attach film are together diced using the dicing film as a base to prepare semiconductor chips; each semiconductor chip with the die attach film is pealed (picked up) from the dicing film by using a pick-up collet on a die bonder; then, the semiconductor chip is subject to thermo-compression bonding (die attach) to mount the semiconductor chip on a circuit board via the die attach film. A multi-stacked film having a dicing film and a die attach film provided on this dicing film is referred to as a dicing die attach film.

As an example of such a dicing die attach film, Patent Literature 1, for instance, describes a dicing die attach film produced by layering a die attach film composed of a curable resin composition containing a curable compound, a curing agent and polyimide particles, and a dicing tape composed of UV-curable acrylic temporary-adhesive.

CITATION LIST

Patent Literature

Patent Literature 1: JP-A-2011-082480 ("JP-A" means an unexamined published Japanese patent application)

SUMMARY OF THE INVENTION

Technical Problem

As semiconductor chips with a die attach film are multi-stacked more, the internal structure of the semiconductor package becomes more compact, so that a die attach film having higher thickness accuracy is required. For example, if the die attach film becomes thicker than its design value and the semiconductor chip is mounted on a circuit board under predetermined mounting conditions based on the design value, a protrusion (bleeding) of the resin is likely to occur. The present inventors have studied the cause of such thickening of the die attach film, and found that volatilization of organic solvent used in varnish for forming the die attach film has some influence. The die attach film is usually formed by applying varnish for forming a die attach film on a release film and drying the resulting coating film. Industrially, a die attach film is formed on a length scale of several meters to several tens of meters from the same varnish while using a coating machine such as a multi-coater. In this case, the organic solvent used for the varnish is generally one that is easily dried and removed in a relatively low temperature range in which the die attach film is not cured. Thus, the organic solvent is likely to volatilize over time from the application start toward the application end, and the component concentration in the varnish increases over time. As a result, the formed die attach film is gradually thickened in the length direction.

In addition, the present inventors have found, in this study, that film thickening due to an increase in the component concentration in the varnish also tends to impair smoothness of the surface of the die attach film. That is, the surface smoothness of the die attach film tends to be deteriorated toward the application end point, and this deterioration in smoothness leads to generation of voids in a die attach step. The cause of the decrease in surface smoothness due to the thickening of the film is not clear, but it is considered as one reason that the component concentration in the varnish varies due to, for example, a local increase in the component concentration of the portion where volatilization of the solvent occurs.

In order to address the problem of film thickening, the present inventors prepared varnish using a solvent having a relatively high boiling point to form a die attach film. However, in this case, it has been found that it is difficult to sufficiently dry and remove the solvent after the varnish is applied. Here, the solvent remaining at the time of thermo-compression bonding in the die attach step is ejected, so that voids are easily generated. The generation of voids not only lowers the bonding strength after thermal curing, but also causes a package crack.

The present invention provides a dicing die attach film including a dicing film and a die attach film stacked on the dicing film such that thickness accuracy at the time of forming the die attach film can be sufficiently secured at the time of its production, bleeding in a die attach step can be stably suppressed upon its use, and generation of voids in the die attach step can also be sufficiently suppressed. Further, the present invention provides a method of producing the dicing die attach film, and a semiconductor package with the dicing die attach film and a method of producing the same.

Solution to Problem

As a result of intensive research in view of the above problems, the present inventors have found that all of the above technical problems can be solved by not using, as an organic solvent to be used in varnish for forming a die attach film, an organic solvent that is commonly used in varnish as what is called a low-boiling point solvent such as methyl ethyl ketone, but employing an organic solvent having a boiling point in a specific limited range of 100° C. or higher and a vapor pressure within a specific range, and further reducing the amount of the organic solvent in the die attach film obtained to a specific level. The present invention is based on these findings, and after further investigation, has been completed.

The above problems of the present invention have been solved by the following means.

[1]

A dicing die attach film, containing:

a dicing film, and a die attach film stacked on the dicing film, wherein the die attach film contains an organic solvent having a boiling point of 100° C. or more and less than 150° C. and a vapor pressure of 50 mmHg or less, and wherein an amount of the organic solvent in the die attach film satisfies the following (a):

(a) when 1.0 g of the die attach film is immersed in 10.0 mL of acetone at 4° C. for 24 hours, an amount of the organic solvent extracted into the acetone is 800 μg or less.

[2]

The dicing die attach film described in [1], wherein the organic solvent has a boiling point of 103 to 135° C. and a vapor pressure of 3.0 to 35.0 mmHg.

[3]

The dicing die attach film described in [2], wherein the amount of the organic solvent extracted into the acetone in the above (a) is 400 μg or less.

[4]

The dicing die attach film described in any one of [1] to [3], wherein the die attach film contains:

an epoxy resin (A), an epoxy resin curing agent (B), a polymer component (C), and an inorganic filler (D), and wherein when the die attach film is heated at a temperature rising rate of 5° C./min from 25° C., a melt viscosity of the die attach film at 120° C. reaches a range of 500 to 10,000 Pas.

[5]

The dicing die attach film described in any one of [1] to [4], wherein the dicing film is energy ray-curable.

[6]

A method of producing the dicing die attach film described in any one of [1] to [5], containing the steps of:

forming a film using varnish obtained by dissolving or dispersing components of the die attach film in an organic solvent having a boiling point of 100° C. or more and less than 150° C. and a vapor pressure of 50 mmHg or less; and subjecting the obtained film to drying treatment to form the die attach film.

[7]

The method of producing a dicing die attach film as described in [6], wherein the organic solvent used for the varnish has a boiling point of 103 to 135° C. and a vapor pressure of 5.0 to 35.0 mmHg.

[8]

A semiconductor package, containing:

a semiconductor chip and a circuit board which are bonded to each other with a thermally cured product of a bonding agent, and/or semiconductor chips which are bonded to each other with a thermally cured product of a bonding agent, wherein the bonding agent is derived from the die attach film of the dicing die attach film described in any one of [1] to [5].

[9]

A method of producing a semiconductor package, containing the steps of:

a first step of thermocompression bonding the dicing die attach film described in any one of [1] to [5] to a back surface of a semiconductor wafer where at least one semiconductor circuit is formed on a surface so that the die attach film is in contact with the back surface of the semiconductor wafer;

a second step of integrally dicing the semiconductor wafer and the die attach film to obtain a semiconductor chip with a bonding agent layer, the semiconductor chip with a bonding agent layer including a piece of the die attach film and a semiconductor chip on the dicing film a third step of removing the semiconductor chip with a bonding agent layer from the dicing film and thermocompression bonding the semiconductor chip with a bonding agent layer and a circuit board via the bonding agent layer; and a fourth step of thermally curing the bonding agent layer.

In the present invention, the numerical ranges expressed with the term "to" refer to ranges including, as the lower limit and the upper limit, the numerical values before and after the term "to".

In the present invention, (meth)acryl means either or both of acryl and methacryl. The same applies to (meth)acrylate.

In the present invention, the terms "upper" and "lower" with respect to the dicing die attach film are used for convenience such that the dicing film side is "lower" and the die attach film side is "upper".

Advantageous Effects of Invention

The dicing die attach film of the present invention include a dicing film and a die attach film stacked on the dicing film, and can sufficiently secure thickness accuracy at the time of forming the die attach film upon its production, stably suppress bleeding in a die attach step upon its use, and also sufficiently suppress generation of voids in the die attach step. The method of producing a dicing die attach film according to the present invention is a method suitable for obtaining the dicing die attach film of the present invention as described above. In addition, a semiconductor package of the present invention can be produced using the dicing die attach film of the present invention, and a good product yield excels because voids and bleeding can be stably suppressed during the die attach step. Further, according to the method of producing the semiconductor package of the present invention, the voids and bleeding during the die attach step can be stably suppressed, so that the yield of the semiconductor package can be effectively increased.

DESCRIPTION OF EMBODIMENTS

[Dicing Die Attach Film]

Figure 1:
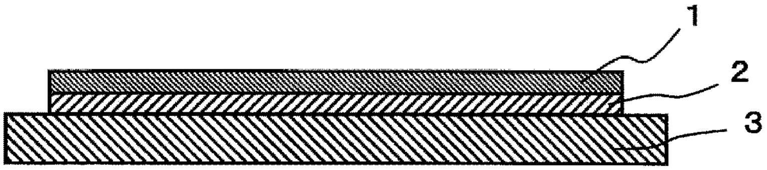
FIG. 1 is a schematic longitudinal cross-sectional view illustrating a preferred embodiment of a first step of a method of producing a semiconductor package of the present invention.

A dicing die attach film of the present invention includes a dicing film (temporary-adhesive film) and a die attach film (bonding agent film) stacked on this dicing film. The dicing film and the die attach film are in contact with each other. The dicing die attach film of the present invention can be in the form in which a dicing film and a die attach film in this order are provided on a base material (also referred to as a substrate film). In addition, a release film, for instance, may be provided on the die attach film.

The case of simply being referred to as the "dicing film" in the present invention, by itself, means a film including, as a component, a temporary-adhesive. That is, when the dicing film has a laminated structure with a substrate film and/or a release film (release liner, releasing film), these substrate film and release film are regarded as another constituent layer different from the dicing film.

Likewise, the case of simply being referred to as the "die attach film" in the present invention, by itself, means a film including, as a component, a bonding agent. That is, when the die attach film has a laminated structure with a substrate film and/or a release film, these substrate film and release film are regarded as another constituent layer different from the die attach film.

On the other hand, in the present invention, the "dicing die attach film" is used in the sense of including all forms that can be distributed in the market as a product. That is, the present invention is not limited to the laminate having a two-layer structure including the dicing film and the die attach film stacked on the dicing film, and as described above, when the substrate film and/or the release film are layered on the dicing film and/or the die attach film, the entire layered structure is regarded as a "dicing die attach film".

In the dicing die attach film of the present invention, the kind and amount of organic solvent (remaining in the die attach film) contained in the die attach film are specified.

Regarding the kind of organic solvent, the die attach film contains an organic solvent (hereinafter, also referred to as "organic solvent (I)") having a boiling point of 100° C. or more and less than 150° C. and a vapor pressure of 50 mmHg or less. In the present invention, the "boiling point" is a boiling point at 1 atm (0.1 MPa), and the "vapor pressure" is a vapor pressure at 25° C. Such organic solvent (I) can be used without particular limitation as long as it satisfies the boiling point and the vapor pressure described above.

The boiling point of the organic solvent (I) is preferably from 100 to 140° C., more preferably from 103 to 135° C., and further preferably from 107 to 132° C.

In addition, the vapor pressure of the organic solvent (I) is preferably 40.0 mmHg or less, more preferably 35.0 mmHg or less, and further preferably 30.0 mmHg or less. The vapor pressure of the organic solvent (I) is usually 3.0 mmHg or more, preferably 7.0 mmHg or more, and also preferably 9.0 mmHg or more.

Specific examples of the organic solvent (I) include methyl isobutyl ketone (boiling point: 116° C., vapor pressure: 15.8 mmHg), cyclopentanone (boiling point: 130° C., vapor pressure: 11.0 mmHg), toluene (boiling point: 111° C., vapor pressure: 28.6 mmHg), propylene glycol 1-monomethyl ether 2-acetate (boiling point: 146° C., vapor pressure: 3.9 mmHg), diethyl ketone (boiling point: 101° C., vapor pressure: 38 mmHg), butyl acetate (boiling point: 126° C., vapor pressure: 9.0 mmHg), and diethyl carbonate (boiling point: 127° C., vapor pressure: 10 mmHg). An epoxy resin, a phenoxy resin, or an acrylic resin commonly used as a binder resin of a die attach film should be easily dissolved. From this viewpoint, the die attach film preferably contains at least one kind of methyl isobutyl ketone, cyclopentanone, and toluene. The die attach film may contain an organic solvent other than the organic solvent (I) as the organic solvent. From the viewpoint of thickness control and dry removability in the step of forming a die attach film, the proportion of the organic solvent other than the organic solvent (I) in the organic solvent contained in the die attach film is preferably 50 mass % or less, more preferably 30 mass % or less, further preferably 20 mass % or less, further preferably 10 mass % or less, and further preferably 5 mass % or less. It is also preferable that all of the organic solvents contained in the die attach film are the organic solvent (I).

When the die attach film contains an organic solvent other than the organic solvent (I), the boiling point and vapor pressure of the organic solvent are not particularly limited. For example, an organic solvent that can be conventionally used as a varnish medium can be used, if appropriate. In addition, an organic solvent having a boiling point of higher than 150° C. may be contained. However, it is premised that the amount of organic solvent in the obtained die attach film can be controlled to the following (a) while the temperature and time do not cause thermal curing of the constituent components of the die attach film during the formation of the die attach film.

The amount of organic solvent contained in the die attach film satisfies the following (a).

(a) When 1.0 g of the die attach film is immersed in 10.0 mL of acetone at 4° C. for 24 hours, an amount of the organic solvent extracted into the acetone is 800 μg or less.

In the above (a), the immersion at 4° C. for 24 hours is performed in a sealed state so that acetone is not volatilized. In the above (a), substantially all of the organic solvent contained in the above die attach film is extracted into acetone. That is, when the organic solvent (I) is extracted and an organic solvent other than the organic solvent (I) is contained in the die attach film, all of the organic solvent (I) and the organic solvent other than the organic solvent (I) are extracted, and the amount of organic solvent in acetone (the amount of the organic solvent other than acetone) is 800 μg or less per 1.0 g of the die attach film.

In the above (a), the amount of the organic solvent extracted into acetone is preferably 600 μg or less, more preferably 400 μg or less, and further preferably 300 μg or less per 1.0 g of the die attach film. This amount of organic solvent is usually 0.1 μg or more per 1.0 g of the die attach film. The amount of the organic solvent extracted into acetone can be determined by the procedure described in the section of EXAMPLES described later.

In the dicing die attach film of the present invention, the above die attach film preferably contains an epoxy resin (A), an epoxy resin curing agent (B), a polymer component (C), and an inorganic filler (D). Each component will be described in this order.

<Epoxy Resin (A)>

The epoxy resin (A) is a thermosetting resin having an epoxy group, and has an epoxy equivalent of 500 g/eq or less. The epoxy resin (A) may be liquid, solid, or semi-solid. The liquid in the present invention means that the softening point is less than 25° C. The solid means that the softening point is 60° C. or more. The semi-solid means that the softening point is between the softening point of the liquid and the softening point of the solid (25° C. or more and less than 60° C.). The softening point of the epoxy resin (A) used in the present invention is preferably 100° C. or less from the viewpoint of obtaining a die attach film that can reach low melt viscosity in a preferable temperature range (e.g., 60 to 120° C.). Incidentally, in the present invention, the softening point is a value measured by the ASTM protocol (measurement condition: in accordance with ASTM D6090-17).

In the epoxy resin (A) used in the present invention, the epoxy equivalent is preferably 150 to 450 g/eq from the viewpoint of increasing the crosslinking density of a cured product, and as a result, increasing the contact ratio between blended inorganic fillers (D) and the contact area between inorganic fillers (D), thus providing higher thermal conductivity. Incidentally, in the present invention, the epoxy equivalent refers to the number of grams of a resin containing 1 gram equivalent of epoxy group (g/eq).

The mass average molecular weight of the epoxy resin (A) is usually preferably less than 10,000 and more preferably 5,000 or less. The lower limit is not particularly limited, but is practically 300 or more.

The mass average molecular weight is a value obtained by GPC (Gel Permeation Chromatography) analysis.

Examples of the skeleton of the epoxy resin (A) include a phenol novolac type, an orthocresol novolac type, a cresol novolac type, a dicyclopentadiene type, a biphenyl type, a fluorene bisphenol type, a triazine type, a naphthol type, a naphthalene diol type, a triphenylmethane type, a tetraphenyl type, a bisphenol A type, a bisphenol F type, a bisphenol AD type, a bisphenol S type, and a trimethylolmethane type. Among them, a triphenylmethane type, a bisphenol A type, a cresol novolac type, and an orthocresol novolac type are preferable from the viewpoint of being capable of obtaining a die attach film having low resin crystallinity and good appearance.

The content of the epoxy resin (A) in the die attach film is preferably from 3 to 70 mass %, preferably from 3 to 30 mass %, and more preferably from 5 to 30 mass %. By setting the content within the above preferable range, it is possible to enhance die attach performance while suppressing the formation of any jig mark. Meanwhile, by adjusting the content to the preferable upper limit or less, generation of oligomer components can be suppressed, and the state of the film (e.g., film tack property) is unlikely to be changed in the case of a small change in temperature.

<Epoxy Resin Curing Agent (B)>

As the epoxy resin curing agent (B), optional curing agents such as amines, acid anhydrides, and polyhydric phenols can be used. In the present invention, a latent curing agent is preferably used from the viewpoint of having a low melt viscosity, and being capable of providing a die attach film that exhibits curability at a high temperature more than a certain temperature, has rapid curability, and further has high storage stability that enables long-term storage at room temperature.

Examples of the latent curing agent include a dicyandiamide compound, an imidazole compound, a curing catalyst-complex polyhydric phenol compound, a hydrazide compound, a boron trifluoride-amine complex, an aminimide compound, a polyamine salt, and modified products or microcapsules thereof. They may be used singly, or in combination of two or more types thereof. Use of an imidazole compound is more preferable from the viewpoint of providing even better latency (properties of excellent stability at room temperature and exhibiting curability by heating) and providing a more rapid curing rate.

The content of the epoxy resin curing agent (B) based on 100 parts by mass of the epoxy resin (A) is preferably from 0.5 to 100 parts by mass, more preferably from 1 to 80 parts by mass, further preferably from 2 to 50 parts by mass, and further preferably from 4 to 20 parts by mass. Setting the content to the preferable lower limit or more can further reduce the curing time, while setting the content to the preferable upper limit or less can prevent the excess curing agent from remaining in the die attach film. As a result, moisture absorption by the remaining curing agent can be suppressed, and thus the reliability of the semiconductor device can be improved.

<Polymer Component (C)>

The polymer component (C) has only to be a component that suppresses a film tack property at normal temperature (25° C.) (property that the film state is likely to change by even a little temperature change) and imparts sufficient adhesiveness and film formability (film forming property) when the die attach film is formed. Examples of the polymer component (C) include natural rubber, butyl rubber, isoprene rubber, chloroprene rubber, an ethylene-vinyl acetate copolymer, an ethylene-(meth)acrylic acid copolymer, an ethylene-(meth)acrylic acid ester copolymer, polybutadiene resin, polycarbonate resin, thermoplastic polyimide resin, polyamide resins such as 6-nylon and 6,6-nylon, phenoxy resin, (meth)acrylic resin, polyester resins such as polyethylene terephthalate and polybutylene terephthalate, polyamideimide resin, fluororesin, and the like. These polymer components (C) may be used singly, or in combination of two or more types thereof.

The mass average molecular weight of the polymer component (C) is usually 10,000 or more. The upper limit is not particularly limited, but is practically 5,000,000 or less.

The mass average molecular weight of the polymer component (C) is a value determined by GPC (Gel Permeation Chromatography) in terms of polystyrene. Hereinafter, the value of the mass average molecular weight of the specific polymer component (C) has the same meaning.

The glass transition temperature (Tg) of the polymer component (C) is preferably less than 100° C., and more preferably less than 90° C. The lower limit is preferably −30° C. or higher, preferably 0° C. or higher, and more preferably 10° C. or higher.

The glass transition temperature of the polymer component (C) is a glass transition temperature measured by DSC at a temperature rising rate of 0.1° C./min. Hereinafter, the value of the glass transition temperature of the specific polymer component (C) has the same meaning.

Note that, in the present invention, with regard to a resin which can have an epoxy group such as phenoxy resin among the epoxy resin (A) and the polymer component (C), a resin having an epoxy equivalent of 500 g/eq or less is classified into the epoxy resin (A) and a resin which does not correspond to the above resin is classified into the component (C).

It is preferable to use at least one kind of phenoxy resin as the polymer component (C), and it is also preferable that the polymer component (C) is a phenoxy resin. The phenoxy resin has a structure similar to that of the epoxy resin (A), and thus has favorable compatibility with the epoxy resin (A). The phenoxy resin has low resin melt viscosity and exhibits excellent effect on adhesiveness. Also, the phenoxy resin has high heat resistance and small saturated water absorption, and thus is preferable from the viewpoint of ensuring the reliability of the semiconductor package. Further, the phenoxy resin is preferable in view of eliminating a tack property and brittleness at normal temperature.

The phenoxy resin can be obtained by a reaction of a bisphenol or biphenol compound with epihalohydrin such as epichlorohydrin, or a reaction of liquid epoxy resin with a bisphenol or biphenol compound.

In any of the reactions, the bisphenol or biphenol compound is preferably a compound represented by the following Formula (A).

Formula (A)

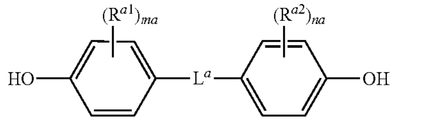

In Formula (A), $L^a$ designates a single bond or divalent linking group, and $R^{a1}$ and $R^{a2}$ each independently designates a substituent. ma and na each independently designates an integer of 0 to 4.

In $L^a$, a divalent linking group is preferably an alkylene group, a phenylene group, —O—, —S—, —SO—, —$SO_2$—, or a group in which an alkylene group and a phenylene group are combined.

The number of carbon atoms of the alkylene group is preferably 1 to 10, more preferably 1 to 6, further preferably 1 to 3, particularly preferably 1 or 2, and most preferably 1.

The alkylene group is preferably —$C(R^\alpha)(R^\beta)$—, and here, $R^\alpha$ and $R^\beta$ each independently designate a hydrogen atom, an alkyl group, or an aryl group. $R^\alpha$ and $R^\beta$ may be bonded to each other to form a ring. $R^\alpha$ and $R^\beta$ are preferably a hydrogen atom or an alkyl group (for example, methyl, ethyl, isopropyl, n-propyl, n-butyl, isobutyl, hexyl, octyl, and 2-ethylhexyl). The alkylene group is, in particular, preferably —$CH_2$—, —$CH(CH_3)$—, or $C(CH_3)_2$—, more preferably —$CH_2$— or —$CH(CH_3)$—, and further preferably —$CH_2$—.

The number of carbon atoms of the phenylene group is preferably 6 to 12, more preferably 6 to 8, and further preferably 6. Examples of the phenylene group include p-phenylene, m-phenylene, and o-phenylene, among which p-phenylene and m-phenylene are preferable.

The group in which an alkylene group and a phenylene group are combined is preferably an alkylene-phenylene-alkylene group, and more preferably —$C(R^\alpha)(R^\beta)$-phenylene-$C(R^\alpha)(R^\beta)$—.

The ring formed by bonding of $R^\alpha$ and $R^\beta$ is preferably a 5- or 6-membered ring, more preferably a cyclopentane ring or a cyclohexane ring, and further preferably a cyclohexane ring.

$L^a$ is preferably a single bond, an alkylene group, —O—, or —$SO_2$—, and more preferably an alkylene group.

$R^{a1}$ and $R^{a2}$ are preferably an alkyl group, an aryl group, an alkoxy group, an alkylthio group, or a halogen atom, and more preferably an alkyl group, an aryl group, or a halogen atom, and further preferably an alkyl group.

ma and na are preferably 0 to 2, more preferably 0 or 1, and further preferably 0.

Examples of the bisphenol or biphenol compound include bisphenol A, bisphenol AD, bisphenol AP, bisphenol AF, bisphenol B, bisphenol BP, bisphenol C, bisphenol E, bisphenol F, bisphenol G, bisphenol M, bisphenol S, bisphenol P, bisphenol PH, bisphenol TMC, bisphenol Z, 4,4'-biphenol, 2,2'-dimethyl-4,4'-biphenol, 2,2',6,6'-tetramethyl-4,4'-biphenol, and cardo skeleton type bisphenol. Bisphenol A, bisphenol AD, bisphenol C, bisphenol E, bisphenol F, and 4,4'-biphenol are preferable, and bisphenol A, bisphenol E, and bisphenol F are more preferable, and bisphenol A is particularly preferable.

The liquid epoxy resin is preferably diglycidyl ether of an aliphatic diol compound, and is more preferably a compound represented by the following Formula (B).

Formula (B)

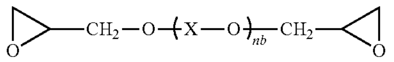

In Formula (B), X designates an alkylene group, and nb designates an integer of 1 to 10.

The number of carbon atoms of the alkylene group is preferably 2 to 10, more preferably 2 to 8, further preferably 3 to 8, particularly preferably 4 to 6, and most preferably 6.

Examples thereof include ethylene, propylene, butylene, pentylene, hexylene, and octylene. Ethylene, trimethylene, tetramethylene, pentamethylene, heptamethylene, hexamethylene, and octamethylene are preferable.

nb is preferably 1 to 6, more preferably 1 to 3, and further preferably 1.

Here, when nb is 2 to 10, X is preferably ethylene or propylene, and further preferably ethylene.

Examples of the aliphatic diol compound in diglycidyl ether include ethylene glycol, propylene glycol, diethylene glycol, triethylene glycol, polyethylene glycol, 1,3-propanediol, 1,4-butanediol, 1,5-heptanediol, 1,6-hexanediol, 1,7-pentanediol, and 1,8-octanediol.

In the above reaction, the phenoxy resin is a phenoxy resin obtained by reacting a single bisphenol or biphenol compound, or aliphatic diol compound, and may be a phenoxy resin obtained by mixing and reacting two or more types of bisphenol or biphenol compound, or aliphatic diol compound. For example, a reaction of diglycidyl ether of 1,6-hexanediol with a mixture of bisphenol A and bisphenol F is exemplified.

The phenoxy resin (C) of the present invention is preferably a phenoxy resin obtained by a reaction of a liquid epoxy resin with a bisphenol or biphenol compound, and more preferably a phenoxy resin having a repeating unit represented by the following Formula (I).

Formula (I)

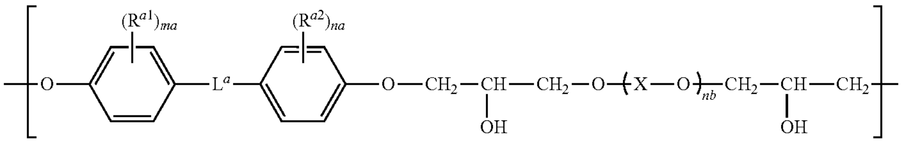

In the formula (I), $L^a$, $R^{a1}$, $R^{a2}$, ma, and na are synonymous with $L^a$, $R^{a1}$, $R^{a2}$, ma, and na, respectively, in the formula (A), and the preferable ranges are also the same. X and nb have the same meanings as those in Formula (B), and the preferable ranges are also the same.

In the present invention, a polymer of bisphenol A and diglycidyl ether of 1,6-hexanediol is preferable among these substances.

Now, focus on the skeleton of the phenoxy resin. In the present invention, a bisphenol A-type phenoxy resin or a bisphenol A-F type copolymerized phenoxy resin may be preferably used. In addition, a low-elastic high-heat-resistant phenoxy resin may be preferably used.

The mass average molecular weight of the phenoxy resin (C) is preferably 10,000 or larger and more preferably from 10,000 to 100,000.

Further, the amount of epoxy group remaining in a small amount in the phenoxy resin (C) is preferably more than 5,000 g/eq in epoxy equivalent amount.

The glass transition temperature (Tg) of the phenoxy resin (C) is preferably less than 100° C., and more preferably less than 90° C. The lower limit is preferably 0° C. or higher and more preferably 10° C. or higher.

The phenoxy resin (C) may be synthesized by the above method, or a commercially available product may be used. Examples of the commercially available product include 1256 (bisphenol A type phenoxy resin, manufactured by Mitsubishi Chemical Corporation), YP-50 (bisphenol A type phenoxy resin, manufactured by NSCC Epoxy Manufacturing Co., Ltd.), YP-70 (bisphenol A/F type phenoxy resin, manufactured by NSCC Epoxy Manufacturing Co., Ltd.), FX-316 (bisphenol F type phenoxy resin, manufactured by NSCC Epoxy Manufacturing Co., Ltd.), FX-280S (cardo skeleton type phenoxy resin, manufactured by NSCC Epoxy Manufacturing Co., Ltd.), 4250 (bisphenol A type/F type phenoxy resin, manufactured by Mitsubishi Chemical Corporation), and FX-310 (low-elastic high-heat-resistant phenoxy resin, manufactured by NSCC Epoxy Manufacturing Co., Ltd.).

It is also preferable to use at least one kind of (meth) acrylic resin as the polymer component (C), and it is also preferable that the polymer component (C) is a (meth)acrylic resin. As the (meth)acrylic resin, a resin composed of a (meth)acrylic copolymer, which is known to be applicable to a die attach film, is used.

The mass average molecular weight of the (meth)acrylic copolymer is preferably 10,000 to 2,000,000, and more preferably 100,000 to 1,500,000. By adjusting the mass average molecular weight to a level within the preferable range, a tack property can be reduced and increase in the melt viscosity can also be suppressed.

The glass transition temperature of the (meth)acrylic copolymer is preferably in a range of −10° C. to 50° C., more preferably 0° C. to 40° C., and further preferably 0° C. to 30° C. By adjusting the glass transition temperature to a level within the preferable range, a tack property can be reduced and generation of voids between the semiconductor wafer and the die attach film, and the like can be suppressed.

Examples of the (meth)acrylic resin include a copolymer containing a (meth)acrylic acid ester component as a constituent component of the polymer. Examples of the (meth) acrylic resin constituent component include components derived from 2-hydroxyethyl acrylate, 2-hydroxyethyl methacrylate, 2-hydroxypropyl acrylate, 2-hydroxypropyl methacrylate, acrylic acid, methacrylic acid, itaconic acid, glycidylmethacrylate, glycidylacrylate, or the like. In addition, the (meth)acrylic resin may have a (meth)acrylic acid ester (e.g., (meth)acrylic acid cycloalkyl ester, (meth)acrylic acid benzyl ester, isobornyl(meth)acrylate, dicyclopentanyl (meth)acrylate, dicyclopentenyl(meth)acrylate, and dicyclopentenyloxyethyl(meth)acrylate) component having a cyclic skeleton as a constituent component. It is also possible to have an imide (meth)acrylate component or a $C_{1-18}$ (meth) acrylic acid alkyl ester (e.g., methyl(meth)acrylate, ethyl (meth)acrylate, propyl(meth)acrylate, butyl(meth)acrylate) component. Also, a copolymer containing vinyl acetate, (meth)acrylonitrile, styrene, or the like may be allowed. Further, a (meth)acrylic resin having a hydroxy group is preferable because compatibility with the epoxy resin is favorable.

The content of the polymer component (C) per 100 parts by mass of the epoxy resin (A) in the die attach film is preferably 1 to 40 parts by mass, more preferably 5 to 35 parts by mass, and further preferably 7 to 30 parts by mass. When the content is in such a range, the rigidity and flexibility of the die attach film before thermal curing are balanced, the film state is good (film tack property is reduced), and film fragility can also be suppressed.

(Inorganic Filler (D))

As the inorganic filler (D), an inorganic filler that can be usually used for a die attach film can be used without particular limitation.

Examples of the inorganic filler (D) include each inorganic powder made of ceramics, such as silica, clay, gypsum, calcium carbonate, barium sulfate, alumina (aluminum oxide), beryllium oxide, magnesium oxide, silicon carbide, silicon nitride, aluminum nitride, boron nitride; a metal or alloys, such as aluminum, copper, silver, gold, nickel, chromium, lead, tin, zinc, palladium, solder; and carbons, such as carbon nanotube, graphene.

The average particle diameter (d50) of the inorganic filler (D) is not particularly limited, and is preferably from 0.01 to 6.0 μm, preferably from 0.01 to 5.0 μm, and more preferably from 0.1 to 3.5 μm from the viewpoint of enhancing the die attach performance while suppressing the formation of any jig mark. The average particle diameter (d50) is a so-called median diameter, and refers to a particle diameter at which the cumulative volume is 50% when the particle size distribution is measured by the laser diffraction scattering method and the total volume of the particles is defined as 100% in the cumulative distribution. In one embodiment of the die attach film, an inorganic filler having an average particle diameter (d50) of 0.1 to 3.5 μm is included when attention is paid to the inorganic filler (D). In another preferable embodiment, it is possible to include an inorganic filler having an average particle diameter (d50) of more than 3.5 μm.

The Mohs hardness of the inorganic filler is not particularly limited, and is preferably 2 or more and more preferably from 2 to 9 from the viewpoint of enhancing the die attach performance while suppressing the occurrence of any jig mark. The Mohs hardness can be measured with a Mohs hardness meter.

The inorganic filler (D) may contain a thermally conductive inorganic filler (inorganic filler having a thermal conductivity of 12 W/m·K or more) in an embodiment, or may contain a thermally non-conductive inorganic filler (inorganic filler having a thermal conductivity of less than 12 W/m·K) in an embodiment.

The inorganic filler (D) having thermal conductivity is a particle made of a thermally conductive material or a particle whose surface is coated with the thermally conductive material. The thermal conductivity of the thermally conductive material is preferably 12 W/m·K or more, and more preferably 30 W/m·K or more.

When the thermal conductivity of the thermally conductive material is the preferable lower limit or more, the amount of the inorganic filler (D) blended in order to obtain a desired thermal conductivity can be reduced. This suppresses increase in the melt viscosity of the die attach film and enables to further improve the filling property of the film into the unevenness of the substrate at the time of compression bonding to the substrate. As a result, generation of voids can be more reliably suppressed.

In the present invention, the thermal conductivity of the thermally conductive material means the thermal conductivity at 25° C., and the literature value for each material can be used. In a case where there is no description in the literatures, for example, the value measured in accordance with JIS R 1611 can be used in the case of ceramics, or the value measured in accordance with JIS H 7801 can be used in the case of metals in substitution for the literature value.

Examples of the inorganic filler (D) having thermal conductivity include thermally conductive ceramics, and preferred examples thereof include alumina particles (thermal conductivity: 36 W/m·K), aluminum nitride particles (thermal conductivity: 150 to 290 W/m·K), boron nitride particles (thermal conductivity: 60 W/m·K), zinc oxide particles (thermal conductivity: 54 W/m·K), a silicon nitride filler (thermal conductivity: 27 W/m·K), silicon carbide particles (thermal conductivity: 200 W/m·K), and magnesium oxide particles (thermal conductivity: 59 W/m·K).

In particular, alumina particles having high thermal conductivity are preferable in terms of dispersibility and availability. Further, aluminum nitride particles and boron nitride particles are preferable from the viewpoint of having even higher thermal conductivity than that of alumina particles. In the present invention, alumina particles and aluminum nitride particles are preferable among these particles.

Additional examples include metal particles having higher thermal conductivity than ceramic, or particles surface-coated with metal. Preferred examples include polymer particles such as silicone resin particles and acrylic resin particles whose surfaces are coated with a single metal filler or metals such as silver (thermal conductivity: 429 W/m·K), nickel (thermal conductivity: 91 W/m·K), gold (thermal conductivity: 329 W/m·K), and the like.

In the present invention, gold or silver particles are more preferable from the viewpoint of, in particular, high thermal conductivity and oxidation resistance deterioration.

The inorganic filler (D) may be subjected to surface treatment or surface modification. Examples of such surface treatment and surface modification include treatment with a silane coupling agent, phosphoric acid or a phosphoric acid compound, or a surfactant. Besides the items described in the present specification, the descriptions of a silane coupling agent, or phosphoric acid or a phosphoric acid compound, and a surfactant in the section of a thermally conductive filler in WO 2018/203527 or the section of an aluminum nitride filler in WO 2017/158994 can be applied, for example.

A method of blending the inorganic filler (D) to the resin components such as the epoxy resin (A), the epoxy resin curing agent (B) and the polymer component (C) includes a method in which a powder inorganic filler and, if necessary, a silane coupling agent, phosphoric acid or a phosphoric acid compound, and a surfactant are directly blended (integral blending method), and a method in which a slurry inorganic filler obtained by dispersing an inorganic filler treated with a surface treatment agent such as a silane coupling agent, phosphoric acid or a phosphoric acid compound, and a surfactant in an organic solvent is blended.

A method of treating the inorganic filler (D) with a silane coupling agent is not particularly limited. Examples thereof include a wet method for mixing the inorganic filler (D) and a silane coupling agent in a solvent, a dry method for mixing the inorganic filler (D) and a silane coupling agent in a gas phase, and the above integral blending method.

In particular, the aluminum nitride particles contribute to high thermal conductivity, but tend to generate ammonium ions due to hydrolysis. It is therefore preferable that the aluminum nitride particles are used in combination with a phenol resin having a low moisture absorption rate and hydrolysis is suppressed by surface modification. As a surface modification method of the aluminum nitride, a method for providing a surface layer with an oxide layer of aluminum oxide to improve water proofness and then preforming surface treatment with phosphoric acid or a phosphoric acid compound to improve affinity with the resin is particularly preferable.

The silane coupling agent is a compound in which at least one hydrolyzable group such as an alkoxy group or an aryloxy group is bonded to a silicon atom. In addition to these groups, an alkyl group, an alkenyl group, or an aryl group may be bonded to the silicon atom. The alkyl group is preferably an alkyl group substituted with an amino group, an alkoxy group, an epoxy group, or a (meth)acryloyloxy group, and more preferably an alkyl group substituted with an amino group (preferably a phenylamino group), an alkoxy group (preferably a glycidyloxy group), or a (meth)acryloyloxy group.

Examples of the silane coupling agent include 2-(3,4-epoxycyclohexyl)ethyltrimethoxysilane, 3-glycidyloxypropyltrimethoxysilane, 3-glycidyloxypropyltriethoxysilane, 3-glycidyloxypropylmethyldimethoxysilane, 3-glycidyloxypropylmethyldiethoxysilane, dimethyldimethoxysilane, dimethyldiethoxysilane, methyltrimethoxysilane, methyltriethoxysilane, phenyltrimethoxysilane, phenyltriethoxysilane, N-phenyl-3-aminopropyltrimethoxysilane, 3-methacryloyloxypropylmethyldimethoxysilane, 3-methacryloyloxypropyltrimethoxysilane, 3-methacryloyloxypropylmethyldiethoxysilane, and 3-methacryloyloxypropyltriethoxysilane.

The silane coupling agent and the surfactant are contained in an amount of preferably 0.1 to 25.0 parts by mass, more preferably 0.1 to 10 parts by mass, and further preferably 0.1 to 2.0 parts by mass based on 100 parts by mass of the inorganic filler (D).

By adjusting the content of the silane coupling agent or the surfactant to the preferable range, it is possible to suppress peeling at the adhesion interface due to volatilization of an excessive silane coupling agent and surfactant in the heating process in semiconductor assembling (for example, a reflow process) while aggregation of the inorganic filler (D) is suppressed. As a result, generation of voids can be suppressed and die attach performance can be improved.

Examples of the shape of the inorganic filler (D) include a flake shape, a needle shape, a filament shape, a spherical shape, and a scale shape. Here, a spherical particle is preferable from the viewpoint of achieving higher filling and fluidity.

In the die attach film, the proportion of the inorganic filler (D) in the total content of the epoxy resin (A), the epoxy resin curing agent (B), the polymer component (C), and the inorganic filler (D) is preferably from 5 to 70 vol %. When the content ratio of the inorganic filler (D) is equal to or more than the above lower limit, it is possible to improve the die attach performance while suppressing the occurrence of any jig mark in the die attach film. Further, a desired melt viscosity may be imparted. Also, in the case of the upper limit or less, the die attach film can be given a desired melt viscosity, and generation of voids can thus be suppressed. Further, such a content proportion allows relaxing of internal stress generated in the semiconductor package during thermal change, and also allows improvement of an adhesive force.

The proportion of the inorganic filler (D) in the total content of the epoxy resin (A), the epoxy resin curing agent (B), the polymer component (C), and the inorganic filler (D) is preferably from 10 to 70 vol %, more preferably from 20 to 60 vol %, and further preferably from 20 to 55 vol %.

The content (vol %) of the inorganic filler (D) can be calculated from the mass content and the specific gravity of each of the epoxy resin (A), the epoxy resin curing agent (B), the polymer component (C), or the inorganic filler (D). In a preferred embodiment of the die attach film, the inorganic filler (D) has an average particle diameter (d50) of 0.01 to 5.0 μm, and the proportion of the inorganic filler (D) in the total content of the epoxy resin (A), the epoxy resin curing agent (B), the polymer component (C), and the inorganic filler (D) is from 5 to 70 vol %.

(Other Components)

The above die attach film may further contain, for example, an organic solvent (e.g., methyl ethyl ketone), an ion trapping agent (ion capturing agent), a curing catalyst, a viscosity adjusting agent, an antioxidant, a flame retardant, and/or a coloring agent. For example, other additives described in WO 2017/158994 may be included.

The percentage of the total content of the epoxy resin (A), the epoxy resin curing agent (B), the phenoxy resin (C), and the inorganic filler (D) in the die attach film can be, for example, 60 mass % or more, preferably 70 mass % or more, further preferably 80 mass % or more, and may also be 90 mass % or more. Also, the percentage may be 100 mass %, and can be 95 mass % or less.

In the die attach film included in the dicing die attach film of the present invention, the melt viscosity at 120° C. when the die attach film before thermal curing is heated at a temperature rising rate of 5° C./min from 25° C. is preferably in a range of 500 to 10,000 Pa·s, more preferably in a range of 1,000 to 10,000 Pa·s, and further preferably in a range of 1,500 to 9,200 Pa·s, from the viewpoint of increasing die attach performance.

The melt viscosity can be determined by the method described in EXAMPLES described later.

Next, a method for forming a die attach film will be described.

<Formation of Die Attach Film>

The die attach film can be formed, for example, by preparing a composition (varnish) for forming a die attach film containing constituent components of the die attach film, applying the composition onto, for example, a release-treated release film (releasing film), and drying the composition. In this composition for forming a die attach film, the above-described organic solvent (I) is used as a liquid medium. The liquid medium may contain an organic solvent other than the organic solvent (I) as described above. The solid content (the total content of respective components excluding the solvent) in the composition for forming a die attach film is preferably from 50 to 95 mass %, more preferably from 60 to 90 mass %, and further preferably from 70 to 88 mass %.

The composition for forming a die attach film prepared as described above can be set in a coating machine such as a multi-coater and applied onto a release film. In this way, a coating film of the composition for forming a die attach film can be continuously formed on the release film of several meters to several tens of meters, and at the same time, the solvent can be removed by heating and drying.

Here, the heating and drying will be described in detail. The low boiling point solvent (e.g., methyl ethyl ketone) that has been used conventionally has some influence on the thickness of the coating film, but the organic solvent can be sufficiently removed from the coating film by short-time treatment at a relatively mild heating temperature (e.g., at about 110 to 130° C.) at a level that does not cause curing of the curable component included in the die attach film. However, when an organic solvent having a certainly high boiling point (e.g., a boiling point of about 160° C.) is used in consideration of the above-described thickness accuracy, a large amount of the organic solvent remains in the obtained die attach film after the above-described drying by short-term gentle heating. This causes a void problem in the die attach step. On the other hand, if the drying time is set to be long, the production efficiency is lowered, and there is also a concern about occurrence of a curing reaction of the curable component included in the die attach film. In addition, when the drying temperature is increased in order to enhance the removal efficiency of the organic solvent, a curing reaction of the curable component included in the die attach film occurs, and there is a possibility that the function as a die attach film is not fulfilled.

Under the above circumstances, the present inventors have found that by using the organic solvent (I) as a liquid medium to be used in a composition for forming a die attach film, the thickness accuracy of a die attach film to be obtained can be sufficiently enhanced, the above (a) can be achieved by drying at a gentle heating temperature for a short period of time, and as defined in the above (a), when the amount of the organic solvent extracted into acetone is up to 800 μg per 1.0 g of the die attach film, the residual organic solvent does not substantially affect generation of voids during a die attach step. Then, the present invention has been completed.

For example, methyl ethyl ketone may be used as the organic solvent and the thickness of the die attach film may be about 5 μm. In this case, when the amount of the organic solvent extracted into acetone in the above (a) is about 1 μg after drying (drying condition-1), the amount of the organic solvent extracted into acetone in the above (a) is suppressed to about 6 μg even if the thickness of the die attach film is about 80 μm. By contrast, methyl isobutyl ketone of the organic solvent (I) may be used as the organic solvent and the thickness of the die attach film may be about 5 μm. In this case, the amount of the organic solvent extracted into acetone in the above (a) is only about 3 μg under the drying condition-1, but when the thickness of the die attach film is about 80 μm, the amount of the organic solvent extracted into acetone in the above (a) increases to about 100 μg under the drying condition-1. At first glance, it seems that the amount of the residual solvent is so large as to lead to generation of voids. However, as a result of examination by the present inventors, when the amount of the residual organic solvent is at this level, there is practically no influence on generation of voids. On the other hand, when cyclohexanone having a boiling point higher than 150° C. is used and the thickness of the die attach film is about 5 μm, the amount of the organic solvent extracted into acetone in the above (a) is a large amount exceeding 800 μg under the drying condition-1. This results in a large increase in the frequency of generation of voids in the die attach step. That is, the upper and lower limits of the range of the boiling point or the vapor pressure of the organic solvent (I) have special technical significance where the organic solvent in the coating film can be quickly dried and removed under mild conditions to a level at which no voids are generated in the die attach step while improving the thickness accuracy of the die attach film.

A method of producing a dicing die attach film according to the present invention preferably contains: forming a film using varnish (composition for forming a die attach film) obtained by dissolving or dispersing components of the die attach film in an organic solvent having a boiling point of 100° C. or more and less than 150° C. and a vapor pressure of 50 mmHg or less; and subjecting the obtained film to drying treatment to form the die attach film.

The above film formation can be performed, for example, by applying varnish onto a release film. In addition, the conditions for drying the film may be set, if appropriate, according to the purpose. When the organic solvent is used, for example, the amount of organic solvent remaining in the obtained die attach film can be reduced to a desired level even by drying at 100 to 150° C. (preferably 110 to 140° C. and more preferably 120 to 135° C.) for 5 minutes or less (preferably 4 minutes or less and further preferably 3 minutes or less).

The thickness of the die attach film is preferably 200 μm or less, more preferably 100 μm or less, and further preferably 80 μm or less. Further, this thickness is set to preferably 30 μm or less, and also preferably 20 μm or less. The thickness of the bonding agent layer is usually 1 μm or more, also preferably 2 μm or more, and may be 4 μm or more.

The thickness of the die attach film can be measured by a contact type linear gauge method (with a desk-top contact type thickness-meter).

As the release film, any release film that functions as a cover film for the die attach film to be obtained can be used, and a publicly known release film can be appropriately employed. Examples thereof include release-treated polypropylene (PP), release-treated polyethylene (PE), and release-treated polyethylene terephthalate (PET). A publicly known method can be employed, if appropriate, as the application method, and examples thereof include a method using, for instance, a roll knife coater, a gravure coater, a die coater, or a reverse coater.

<Dicing Film>

A general configuration used as a dicing film (dicing tape) can be applied, if appropriate, to the dicing film included as a component in the dicing die attach film of the present invention. In addition, as a method of forming a dicing film, a common method can be applied, if appropriate. As the temporary-adhesive constituting the dicing film, general temporary-adhesives used for application to the dicing film, for example, an acrylic temporary-adhesive, a rubber temporary-adhesive, and the like can be suitably used. Among them, the dicing film is preferably energy ray-curable.

Examples of the acrylic temporary-adhesive include a resin composed of a copolymer of (meth)acrylic acid and (meth)acrylic acid ester. As the acrylic temporary-adhesive, a resin composed of a copolymer containing (meth)acrylic acid, (meth)acrylic acid ester, and an unsaturated monomer copolymerizable with these substances (e.g., vinyl acetate, styrene, acrylonitrile) is preferably used. Further, two or more types of these resins may be mixed. Among them, preferred is a copolymer containing one or more types selected from methyl(meth)acrylate, ethylhexyl(meth)acrylate, and butyl(meth)acrylate and one or more types selected from hydroxyethyl(meth)acrylate and vinyl acetate. This facilitates control of adhesion or adhesiveness to the adherend.

In order to make the dicing film used in the present invention energy ray-curable, it is possible to introduce a polymerizable group (e.g., a carbon-carbon unsaturated bond) into a polymer constituting the dicing film or blend a polymerizable monomer in the dicing film. This polymerizable monomer preferably has two or more (preferably three or more) polymerizable groups.

Examples of the energy ray include an ultraviolet ray, an electron beam, or the like.

Regarding the configuration of the dicing film used in the present invention, for example, the descriptions of JP-A-2010-232422, Japanese Patent No. 2661950, JP-A-2002-226796, JP-A-2005-303275, and the like can be used as a reference.

The thickness of the dicing film is preferably 1 to 200 μm, more preferably 2 to 100 μm, further preferably 3 to 50 μm, and also preferably 5 to 30 μm.

In the dicing die attach film of the present invention, the peeling strength between the dicing film and the die attach film in the range of 25 to 80° C. is preferably 0.40 N/25 mm or less. This peeling strength is a peeling strength between the dicing film and the die attach film after irradiation with energy rays when the dicing film is energy ray-curable.

The peeling strength is determined according to the following conditions. Measurement condition: in accordance with JIS Z0237, 180° peel test Measurement apparatus: tensile tester (manufactured by Shimadzu Corporation, model No.: TCR1 L type)

<Production of Dicing Die Attach Film>

The method of producing a dicing die attach film according to the present invention is not particularly limited as long as the dicing film and the die attach film can be stacked to give a structure.

For example, a coating liquid containing a temporary-adhesive is applied onto a release-treated release liner and dried to form a dicing film, and then the dicing film and a substrate film are bonded. Thus, a layered body in which the substrate film, the dicing film, and the release liner are layered in this order is produced. Separately from this, the composition for forming a die attach film is applied onto a release film (having the same meaning as a release liner, but for convenience the expression is changed here), and dried to form a die attach film on the release film. Then, the dicing film and the die attach film are bonded in such a manner that the dicing film exposed by peeling off the release liner and the die attach film are in contact. Thus, a dicing die attach film in which the substrate film, the dicing film, the die attach film, and the release film are laminated in this order can be obtained.

Bonding of the dicing film and the die attach film is preferably performed under a pressurized condition.

In the bonding of the dicing film and the die attach film, the shape of the dicing film is not particularly limited as long as the opening of a ring frame can be covered, but is preferably a circular shape. The shape of the die attach film is not particularly limited as long as the back surface of the wafer can be covered, but is preferably a circular shape. The dicing film is larger than the die attach film, and preferably has a shape having a portion in which the temporary-adhesive layer is exposed around the bonding agent layer. As such, it is preferable to bond the dicing film and the die attach film which are cut into a desired shape.

The dicing die attach film produced as described above is used by peeling the release film off upon use.

[Semiconductor Package and Method of Producing the Same]

Then, preferred embodiments of a semiconductor package and a method of producing the same of the present invention will be described in detail with reference to the drawings. Note that, in the descriptions and drawings below, the same reference numerals are given to the same or corresponding components, and overlapping descriptions will be omitted. FIGS. 1 to 7 are schematic longitudinal cross-sectional views each illustrating a preferred embodiment of each step of a method of producing a semiconductor package of the present invention.

In the method of producing a semiconductor package of the present invention, as a first step, as illustrated in FIG. 1, firstly, the die attach film 2 side of the dicing die attach film of the present invention is thermocompression bonded to the back surface of a semiconductor wafer 1 where at least one semiconductor circuit is formed on the surface (that is, a surface of the semiconductor wafer 1 on which the semiconductor circuit is not formed) to provide the die attach film 2 and a dicing film 3 on the semiconductor wafer 1. In FIG. 1, the die attach film 2 is illustrated smaller than the dicing film 3, but the sizes (areas) of both films are set, if appropriate, according to the purpose. Regarding the condition of thermocompression bonding, thermocompression bonding is performed at a temperature at which the epoxy resin (A) is not thermally cured actually. Examples include the condition at a temperature of about 70° C. and a pressure of about 0.3 MPa.

As the semiconductor wafer 1, a semiconductor wafer where at least one semiconductor circuit is formed on the surface can be appropriately used. Examples of such a wafer include a silicon wafer, a SiC wafer, a GaAs wafer, or a GaN wafer. In order to provide the dicing die attach film of the present invention on the back surface of the semiconductor wafer 1, for example, a publicly known apparatus such as a roll laminator or a manual laminator can be appropriately used.

Figure 2:
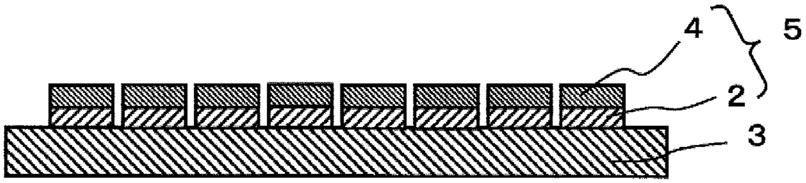
FIG. 2 is a schematic longitudinal cross-sectional view illustrating a preferred embodiment of a second step of a method of producing a semiconductor package of the present invention.

Next, as a second step, as illustrated in FIG. 2, the semiconductor wafer 1 and the die attach film 2 are integrally diced to give a semiconductor chip 5 with a bonding agent layer, the semiconductor chip 5 including, on the dicing film 3, a semiconductor chip 4 obtained by dicing the semiconductor wafer and a die attach film piece 2 (bonding agent layer 2) obtained by dicing the die attach film 2. Further, an apparatus used for dicing is not particularly limited, and a common dicing apparatus can be used, if appropriate.

Figure 3:
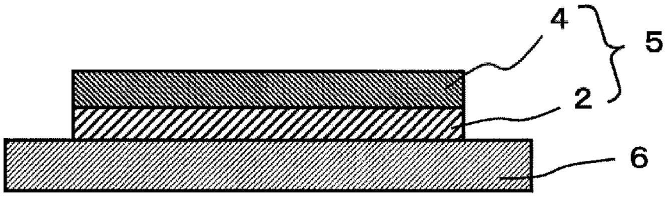
FIG. 3 is a schematic longitudinal cross-sectional view illustrating a preferred embodiment of a third step of a method of producing a semiconductor package of the present invention.

Next, as a third step, the dicing film is cured with energy rays as necessary to reduce the adhesive force, and the bonding agent layer 2 is peeled off from the dicing film 3 by pickup. Then, as illustrated in FIG. 3, the semiconductor chip 5 with a bonding agent layer and the circuit board 6 are thermocompression bonded via the bonding agent layer 2 to mount the semiconductor chip 5 with a bonding agent layer on the circuit board 6. As the circuit board 6, a substrate where a semiconductor circuit is formed on the surface can be appropriately used. Examples of such a substrate include a print circuit board (PCB), various lead frames, and a substrate where electronic components such as a resistive element and a capacitor are mounted on the surface of a substrate.

A method of mounting the semiconductor chip 5 with a bonding agent layer on such a circuit board 6 is not particularly limited, and a conventional thermocompression bonding-mediated mounting method can be adopted, if appropriate.

Then, as a fourth step, the bonding agent layer 2 is thermally cured. The temperature of the thermal curing is not particularly limited as long as the temperature is equal to or higher than a temperature at which thermal curing starts in the bonding agent layer 2, and is adjusted, if appropriate, depending on the types of the epoxy resin (A), the polymer component (C), and the epoxy curing agent (B) used. For example, the temperature is preferably from 100 to 180° C. and more preferably from 140 to 180° C. from the viewpoint of curing in a shorter time. If the temperature is too high, the components in the bonding agent layer 2 tend to be volatilized during the curing process. This is likely to cause foaming. The duration of this thermal curing treatment may be set, if appropriate, according to the heating temperature, and can be, for example, from 10 to 120 minutes.

Figure 4:
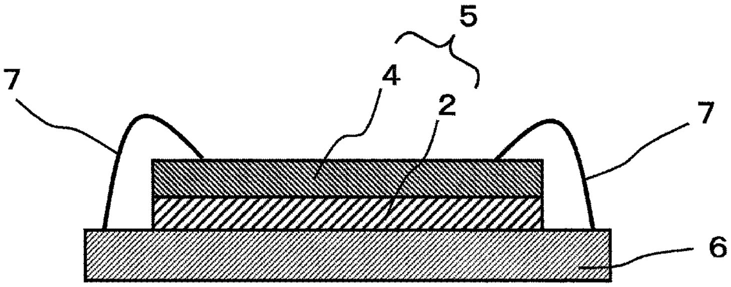
FIG. 4 is a schematic longitudinal cross-sectional view illustrating a preferred embodiment of a step of connecting a bonding wire of a method of producing a semiconductor package of the present invention.

In the method of producing a semiconductor package of the present invention, it is preferable that the circuit board 6 and the semiconductor chip 5 with a bonding agent layer are connected via a bonding wire 7 as illustrated in FIG. 4. Such a connection method is not particularly limited, and a publicly known method, for example, a wire bonding method or a TAB (Tape Automated Bonding) method can be employed, if appropriate.

Figure 5:
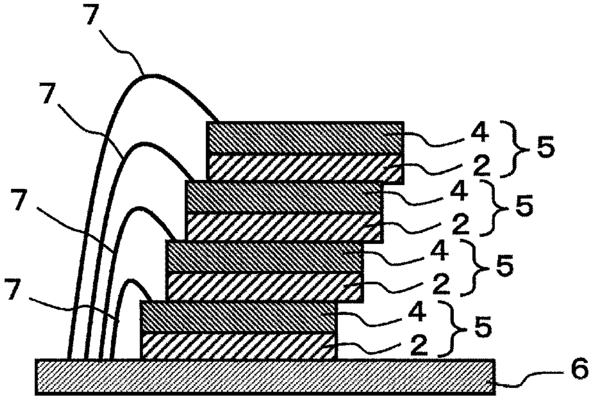
FIG. 5 is a schematic longitudinal cross-sectional view illustrating an example of an embodiment of multistacking of a method of producing a semiconductor package of the present invention.
Figure 6:
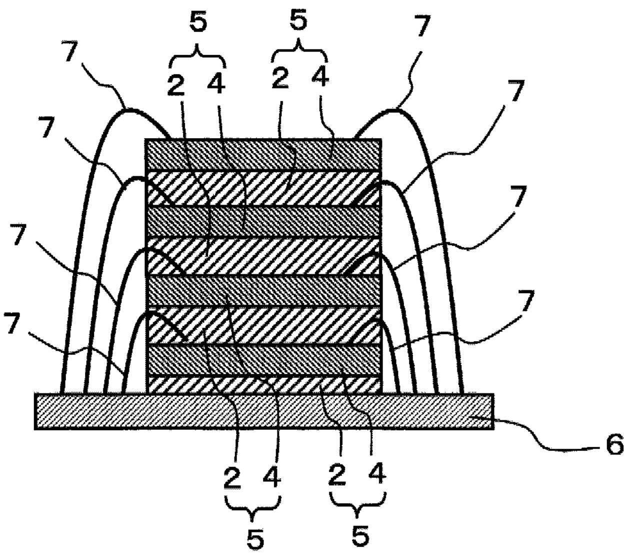
FIG. 6 is a schematic longitudinal cross-sectional view illustrating an example of an embodiment of another multistacking of a method of producing a semiconductor package of the present invention.

Further, a plurality of semiconductor chips 4 can be stacked by thermocompression bonding another semiconductor chip 4 to a surface of the mounted semiconductor chip 4, performing thermal curing, and then connecting the semiconductor chips 4 again to the circuit board 6 by wire bonding. Examples of the stacking method include a method of stacking the semiconductor chips in slightly different positions as illustrated in FIG. 5, and a method of stacking the semiconductor chips by increasing the thicknesses of the bonding agent layers 2 of the second layer or later and thereby embedding the bonding wire 7 in each bonding agent layer 2 as illustrated in FIG. 6.

Figure 7:
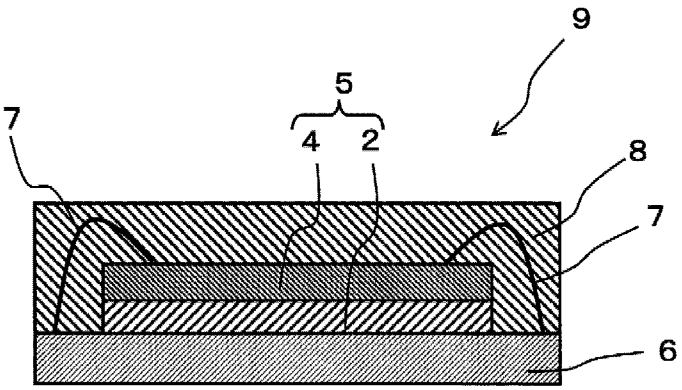
FIG. 7 is a schematic longitudinal cross-sectional view illustrating a preferred embodiment of a semiconductor package produced by a method of producing a semiconductor package of the present invention.

In the method of producing a semiconductor package of the present invention, it is preferable to seal the circuit board 6 and the semiconductor chip 5 with a bonding agent layer by using a sealing resin 8 as illustrated in FIG. 7. In this way, a semiconductor package 9 can be obtained. The sealing resin 8 is not particularly limited, and a publicly known sealing resin that can be used for the production of the semiconductor package can be used, if appropriate. In addition, a sealing method using the sealing resin 8 is not particularly limited, and a routinely conducted method can be employed.

EXAMPLES

Hereinafter, the present invention will be described in more detail based on Examples and Comparative Examples. However, the present invention is not limited to the following Examples. Meanwhile, the room temperature means 25° C., MEK represents methyl ethyl ketone, and MIBK represents methyl isobutyl ketone.

Example 1

<Production of Dicing Film (Temporary-Adhesive Film)>

(1) Production of Substrate Film

Resin pellets of low density polyethylene (LDPE, density: 0.92 g/cm$^3$, melting point: 110° C.) were melted at 230° C. and then extruded into a long film with a thickness of 70 μm by using an extruder. The obtained film was irradiated with 100 kGy of electron beams, thus producing a substrate film.

(2) Formation of Dicing Film

A copolymer containing 50 mol % of butylacrylate, 45 mol % of 2-hydroxyethyl acrylate, and 5 mol % of methacrylic acid and having a mass average molecular weight of 800,000 was prepared. Next, 2-isocyanatoethyl methacrylate was added to the copolymer so that the iodine value was 20, thus preparing an acrylic copolymer having a glass transition temperature of −40° C., a hydroxyl value of 30 mgKOH/g, and an acid value of 5 mgKOH/g.

Thereafter, 5 parts by mass of Coronate L (trade name, manufactured by Nippon Polyurethane Industry Co., Ltd.) as polyisocyanate and 3 parts by mass of Esacure KIP 150 (trade name, manufactured by Lamberti) as a photopolymerization initiator were added to 100 parts by mass of the prepared acrylic copolymer to prepare a mixture. The mixture was dissolved in ethyl acetate and the solution was stirred to prepare a temporary-adhesive composition.

Then, this temporary-adhesive composition was applied onto a release liner made of a release-treated polyethylene terephthalate (PET) film to have a dry thickness of 20 μm, and then dried at 110° C. for 3 minutes, thus forming a dicing film. The prepared substrate film and the dicing film were bonded to produce a film in which three layers of the release liner, the dicing film, and the substrate film are stacked.

<Production of Die Attach Film (Bonding Agent Film)>

In a 1,000-mL separable flask, 56 parts by mass of triphenylmethane type epoxy resin (trade name: EPPN-501H, mass average molecular weight: 1,000, softening point: 55° C., semi-solid, epoxy equivalent amount: 167 g/eq, manufactured by Nippon Kayaku Co., Ltd.), 49 parts by mass of bisphenol A type epoxy resin (trade name: YD-128, mass average molecular weight: 400, softening point: less than 25° C., liquid, epoxy equivalent amount: 190 g/eq, manufactured by NSCC Epoxy Manufacturing Co., Ltd.), 30 parts by mass of bisphenol A type phenoxy resin (trade name: YP-50, mass average molecular weight: 70,000, Tg: 84° C., normal temperature (25° C.) elastic modulus: 1,700 MPa, manufactured by NSCC Epoxy Manufacturing Co., Ltd.), and 90 parts by mass of MIBK were heated with stirring at 110° C. for 2 hours, thus obtaining a resin varnish.

Subsequently, this resin varnish was transferred to an 800-mL planetary mixer, and 205 parts by mass of alumina filler (trade name: AO-502, manufactured by Admatechs, average particle diameter (d50): 0.6 μm) was introduced to the mixer. Further, 8.5 parts by mass of imidazole-based curing agent (trade name: 2PHZ-PW, manufactured by Shikoku Chemicals Corporation) and 3.0 parts by mass of silane coupling agent (trade name: Sila-Ace S-510, manufactured by JNC Corporation) were introduced to the mixer, and the contents were then mixed with stirring for 1 hour at room temperature. Then defoaming under vacuum was conducted, thus obtaining a mixed varnish (composition for forming a die attach film).

Then, the obtained mixed varnish was applied on a release-treated PET film (release film) having a thickness of 38 μm by using a multi coater (head part: a knife coater, model: MPC-400 L, manufactured by Matsuoka Machinery Co., Ltd.) at a treatment temperature of 130° C. (drying furnace: 1.5 m) and a linear velocity of 1.0 m/min (retention time: 1.5 min) so that the film thickness after drying was set to 5 μm (the thickness of the obtained die attach film should be 5.0 μm) to obtain a two-layer laminated film in which a die attach film having a width of 220 mm and a length of 10 m was formed on the release film.

<Production of Dicing Die Attach Film>

Then, the dicing film-containing 3-layer laminated body was cut into a circular shape so that the laminated body can be bonded to cover the opening of a ring frame. Further, the die attach film-containing 2-layer laminated body was cut into a circular shape to cover the back surface of the wafer.

The dicing film exposed by peeling off the release liner from the 3-layer laminated body cut as described above and the die attach film of the 2-layer laminated body cut as described above were bonded by using a roll press machine under conditions at a load of 0.4 MPa and a rate of 1.0 m/min, thus producing a dicing die attach film, in which the substrate film, the dicing film, the die attach film, and the release film were layered in this order. In this dicing die attach film, the dicing film is larger than the die attach film and has a portion where the dicing film is exposed around the die attach film.

Example 2

The same procedure as in Example 1 was repeated, except that the thickness of the resulting die attach film in Example 1 should be 20.0 μm, to produce a dicing die attach film.

Example 3

The same procedure as in Example 1 was repeated, except that the thickness of the resulting die attach film in Example 1 should be 80.0 μm, to produce a dicing die attach film.

Example 4

The same procedure as in Example 3 was repeated, except that the varnish for forming a die attach film in Example 3 was prepared using 90 parts by mass of cyclopentanone instead of 90 parts by mass of MIBK, to produce a dicing die attach film.

Example 5

The same procedure as in Example 3 was repeated, except that the varnish for forming a die attach film in Example 3 was prepared using 90 parts by mass of toluene instead of 90 parts by mass of MIBK, to produce a dicing die attach film.

Example 6

The same procedure as in Example 3 was repeated, except that the varnish for forming a die attach film in Example 3 was prepared using 360 parts by mass of silver filler (trade name: AG-4-8F; manufactured by DOWA Electronics Materials Co., Ltd.; with an average particle diameter (d50): 2.0 μm) instead of alumina filler and the amount of MIBK blended was 130 parts by mass, to produce a dicing die attach film.

Example 7

The same procedure as in Example 3 was repeated, except that the varnish for forming a die attach film in Example 3 was prepared using 400 parts by mass of silica filler (trade name: FB-3SDX; manufactured by Denka Company Limited; with an average particle diameter (d50): 3.0 μm) instead of alumina filler and the amount of cyclopentanone blended was 135 parts by mass, to produce a dicing die attach film.

Example 8

The same procedure as in Example 5 was repeated, except that instead of bisphenol A-type phenoxy resin, which was a component of the die attach film, 120 parts by mass (including 30 parts by mass of acrylic resin) of acrylic resin solution (trade name: S-2060; mass average molecular weight: 500,000; Tg: −23° C.; room temperature (25° C.) elastic modulus: 50 MPa; solid content: 25% (organic solvent: toluene); manufactured by TOAGOSEI CO., LTD.) was used in Example 5, to produce a dicing die attach film. Note that the organic solvent in the varnish was 90 parts by mass of toluene contained in the acrylic resin solution.

Comparative Example 1

The same procedure as in Example 1 was repeated, except that the varnish for forming a die attach film in Example 1 was prepared using 90 parts by mass of MEK instead of 90 parts by mass of MIBK, to produce a dicing die attach film.

Comparative Example 2

The same procedure as in Comparative Example 1 was repeated, except that the thickness of the resulting die attach film in Comparative Example 1 should be 80.0 μm, to produce a dicing die attach film.

Comparative Example 3

The same procedure as in Example 1 was repeated, except that the varnish for forming a die attach film in Example 1 was prepared using 90 parts by mass of cyclohexanone instead of 90 parts by mass of MIBK, to produce a dicing die attach film.

Comparative Example 4

The same procedure as in Comparative Example 3 was repeated, except that the thickness of the resulting die attach film in Comparative Example 3 should be 80.0 μm, to produce a dicing die attach film.

Comparative Example 5

The same procedure as in Comparative Example 4 was repeated, except that the treatment temperature in the multi-coater during the formation of the die attach film in Comparative Example 4 was changed from 130° C. (drying furnace: 1.5 m) to a treatment temperature of 160° C. (drying furnace: 1.5 m), to produce a dicing die attach film.

Comparative Example 6

The same procedure as in Example 3 was repeated, except that the linear velocity in the multi-coater during the formation of the die attach film in Example 3 was changed from 1.0 m/min (retention time: 1.5 min) to a linear velocity of 5.0 m/min (retention time: 0.3 min), to produce a dicing die attach film.

[Measurement/Test/Evaluation]

Each dicing die attach film obtained in each of the above Examples or Comparative Examples was measured, tested, and evaluated with respect to the following items.

The table below collectively provides the results.

<Evaluation of Die Attach Film Thickness Accuracy>

For each die attach film (width 220 mm, length 10 m) formed in each of the above Examples or Comparative Examples, the thickness of application start portion (area of width 220 mm×length 30 mm between an application start point and length 30 mm toward an application end point) was measured at 6 points with equal intervals (30 mm intervals) in the width direction, while using a high-precision digital length meter (model: LIGHTMATIC VL-50S; manufactured by Mitutoyo Corporation), as the total thickness under the laminated state with the release film, and the average value thereof was determined. Likewise, the thickness of application end portion (area of width 200 mm×length 30 mm between an application end point and length 30 mm toward an application start point) was also measured at 6 points with equal intervals (30 mm intervals) in the width direction as the total thickness in the laminated state with the release film, and the average value thereof was determined. Next, for each of the application start portion or the application end portion, the thickness of the release film alone was measured at 6 points with equal intervals (30 mm intervals) in the width direction, and the average value thereof was determined. The averaged thickness of the release film alone at the application start portion was subtracted from the averaged total thickness in the laminated state at the application start portion to give the thickness (T1) of the die attach film at the application start portion. Likewise, the thickness (T2) of the die attach film at the application end portion was also calculated.

<Amount of Organic Solvent Extracted into 10.0 mL of Acetone from 1.0 g of Die Attach Film>

For each die attach film (width 200 mm, length 10 m) formed in each of the above Examples or Comparative Examples, the intermediate application portion (having, as the middle, a point 5 m ahead from the application start point toward the application end point) was cut into a square having a size of 5.0 cm long×5.0 cm wide, and the release film was peeled off from the cut sample. Next, 1.0 g of the remaining die attach film portion was precisely weighed, and placed in a glass container. Then, 10 mL of acetone was poured in this glass container, and 1.0 g of the die attach film piece was immersed in acetone, sealed, and allowed to stand in a refrigerator for 24 hours. Thereafter, the supernatant was analyzed using a GC/MS apparatus (model: JMS-Q1050GC, manufactured by JEOL Ltd.) under the following conditions, and the amount μg of organic solvent per 1 g of the die attach film was quantified.

Column: J&W DB-1 (30 m×0.25 mm ID×1.0 μm)

GC temperature: 40° C. (4 min)→20° C./min→200° C.

Carrier gas: He, 1.0 ml/min
Inlet temperature: 200° C.
Injection volume: 1 μL

<Melt Viscosity of Die Attach Film>

For each die attach film formed in each of the above Examples or Comparative Examples, the intermediate application portion (having, as the middle, a point 5 m ahead from the application start point toward the application end point) was cut into a square having a size of 5.0 cm long×5.0 cm wide; the release film was peeled off from the cut sample; and the remaining die attach film portion was provided as a sample. For each die attach film, a plurality of samples were prepared, laminated, and bonded on a hot plate at a stage temperature of 70° C. by using a hand roller to give a test piece of bonding agent layer having a thickness of about 1.0 mm.

A change in viscosity resistance in a temperature range of 20 to 250° C. at a temperature rising rate of 5° C./min was measured for this test piece by using a rheometer (RS6000, manufactured by Haake). The melt viscosities at 120° C. (Pa·s) were each calculated from the obtained temperature-viscosity resistance curve.

<Die Attach Performance Evaluation>

—Evaluation of Voids—

For the die attach film formed in each of the above Examples or Comparative Examples, a dicing die attach film was produced using the application end portion thereof (between 80 cm and 120 cm while the application end point was set at 0 cm and the length extended toward the application start point). Using the obtained dicing die attach film, the frequency of generation of voids was evaluated as follows.

The release film was peeled off. The die attach film surface exposed was then bonded to one surface of a dummy silicon wafer (size: 8 inch, thickness: 100 μm) by using a manual laminator (trade name: FM-114, manufactured by Technovision, Inc.) at a temperature of 70° C. and a pressure of 0.3 MPa.

Then, dicing was performed from the dummy silicon wafer side to form squares each having a size of 10 mm×10 mm by using a dicing apparatus (trade name: DFD-6340, manufactured by DISCO Corporation) equipped with two axes of dicing blades (Z1: NBC-ZH2050 (27HEDD), manufactured by DISCO Corporation/Z2: NBC-ZH127F-SE (BC), manufactured by DISCO Corporation), thus obtaining each dummy chip with a diced die attach film piece (a bonding agent layer) on the dicing film.

Subsequently, the prepared dummy chip with a bonding agent layer was irradiated with ultraviolet rays from the back surface side of the wafer by using an ultraviolet ray irradiator (trade name: RAD-2000F/8, manufactured by Lintec Corporation, irradiation amount: 200 $mJ/cm^2$). Then, the dummy chip with a bonding agent layer was pasted on and thermocompression bonded to the mounting surface side of a lead frame substrate (42Arroy-based, manufactured by Toppan Printing Co., Ltd.) by using a die bonder (trade name: DB-800, manufactured by Hitachi High-Tech Corporation) under the following pickup and die attach conditions. Thereafter, the film was treated at 150° C. for 1 hour in an oven and thermally cured.

The presence or absence of generation of voids at the interface between the bonding agent layer and the mounting surface of the lead frame substrate was observed for the dummy chip with a bonding agent layer, which was thermocompression bonded on the lead frame substrate and thermally cured, as described above, by using an ultrasonic flaw detector (SAT) (FS300III, manufactured by Hitachi Power Solutions Co., Ltd.). The die attach performance was evaluated based on the following criteria.

—Pickup Conditions—

Number of needles: 5 (350R), needle height: 200 μm, pickup timer: 100 msec

—Die Attach Conditions—

120° C., pressure 0.1 MPa (load 400 gf), time 1.0 second or 0.5 second

—Evaluation Criteria—

AA: No voids are observed in all of the 24 dummy chips mounted for a mounting time of 0.5 second.

A: No voids are observed in all of the 24 dummy chips mounted for a mounting time of 1.0 second although the voids do not fall under the above AA.

B: Not fall under the above AA, and there are 1 or 2 chips in which voids have occurred among the 24 dummy chips mounted for a mounting time of 1.0 second.

C: Not fall under the above AA, and there are 3 to 5 chips in which voids have occurred among the 24 dummy chips mounted for a mounting time of 1.0 second.

D: Not fall under the above AA, and there are 6 or more chips in which voids have occurred among the 24 dummy chips mounted for a mounting time of 1.0 second.

—Bleeding Evaluation—

In the same manner as described in <Die attach performance evaluation>, thermocompression bonding was performed on a lead frame substrate, and then a thermally cured dummy chip with a bonding agent layer was obtained. For this dummy chip with a bonding agent layer, the four side surfaces of each chip at the interface between the dummy chip and the lead frame substrate were observed, from the vertical direction (lamination direction), with a measuring microscope (model: MF-A4020D, manufactured by Mitutoyo Corporation) under the observation condition in which an objective lens (×3 magnification) was set. A sample having a protrusion of 10 μm or more on at least one surface was determined to have bleeding, and occurrence of bleeding was evaluated based on the following evaluation criteria.

—Pickup Conditions—

Number of needles: 5 (350R), needle height: 200 μm, pickup timer: 100 msec

—Die Attach Conditions—

120° C., pressure 0.1 MPa (load 400 gf), time 1.0 second or 0.5 second

—Evaluation Criteria—

AA: No bleeding is observed in all of the 24 dummy chips mounted for a mounting time of 1.0 second.

A: No bleeding is observed in all of the 24 dummy chips mounted for a mounting time of 0.5 second although the bleeding does not fall under the above AA.

B: Not fall under the above AA, and there are 1 or 2 chips in which bleeding has occurred among the 24 dummy chips mounted for a mounting time of 0.5 second.

C: Not fall under the above AA, and there are 3 to 5 chips in which bleeding has occurred among the 24 dummy chips mounted for a mounting time of 0.5 second.

D: Not fall under the above AA, and there are 6 or more chips in which bleeding has occurred among the 24 dummy chips mounted for a mounting time of 0.5 second.

TABLE 1

| | | | Example 1 | Example 2 | Example 3 | Example 4 |
|---|---|---|---|---|---|---|
| Die attach film composition (parts by mass) | Epoxy resin | EPPN-501H (Triphenylmethane-type epoxy resin) | 56 | 56 | 56 | 56 |
| | | YD-128 (Liquid bis A-type epoxy resin) | 49 | 49 | 49 | 49 |
| | Polymer component | YP-50 (Bis A-type phenoxy resin) | 30 | 30 | 30 | 30 |
| | | S-2060 (Acrylic resin) | | | | |
| | Inorganic filler | AO502 (Alumina) | 205 | 205 | 205 | 205 |
| | | AG-4-8F (Silver) | | | | |
| | | FB-3SDX (Silica) | | | | |
| | S-510 (Epoxysilane-type silane coupling agent) | | 3.0 | 3.0 | 3.0 | 3.0 |
| | 2PHZ-PW (Imidazole-based curing agent) | | 8.5 | 8.5 | 8.5 | 8.5 |
| | Total solid content | | 351 | 351 | 351 | 351 |
| | Inorganic filler loading amount (vol %) | | 30% | 30% | 30% | 30% |
| Organic solvent in varnish for forming die attach film | Kind of organic solvent | | MIBK | MIBK | MIBK | Cyclo-pentanone |
| | Amount of organic solvent (parts by mass) | | 90 | 90 | 90 | 90 |
| | Content of organic solvent in varnish (mass %) | | 20% | 20% | 20% | 20% |
| Die attach film drying conditions | Drying temperature | | 130° C. | 130° C. | 130° C. | 130° C. |
| | Retention time (minutes) | | 1.5 | 1.5 | 1.5 | 1.5 |
| | Intended film thickness (μm) | | 5.0 | 20.0 | 80.0 | 80.0 |
| Film thickness T1 (μm) of application start portion | | | 4.8 | 19.9 | 80.0 | 80.1 |
| Film thickness T2 (μm) of application end portion | | | 5.5 | 20.1 | 81.8 | 80.4 |
| Amount of organic solvent (μg) per 1.0 g of die attach film | | | 3.0 | 6.0 | 100.0 | 255.0 |
| Melt viscosity (Pa · s) of die attach film at 120° C. | | | 6900 | 6900 | 6900 | 7100 |
| Die attach performance evaluation | Voids | | A | AA | AA | A |
| | Bleeding | | AA | AA | A | A |

| | | | Example 5 | Example 6 | Example 7 | Example 8 |
|---|---|---|---|---|---|---|
| Die attach film composition (parts by mass) | Epoxy resin | EPPN-501H (Triphenylmethane-type epoxy resin) | 56 | 56 | 56 | 56 |
| | | YD-128 (Liquid bis A-type epoxy resin) | 49 | 49 | 49 | 49 |
| | Polymer component | YP-50 (Bis A-type phenoxy resin) | 30 | 50 | 30 | |
| | | S-2060 (Acrylic resin) | | | | 30 |
| | Inorganic filler | AO502 (Alumina) | 205 | | | 205 |
| | | AG-4-8F (Silver) | | 360 | | |
| | | FB-3SDX (Silica) | | | 400 | |
| | S-510 (Epoxysilane-type silane coupling agent) | | 3.0 | 3.0 | 3.0 | 3.0 |
| | 2PHZ-PW (Imidazole-based curing agent) | | 8.5 | 8.5 | 8.5 | 8.5 |
| | Total solid content | | 351 | 526 | 546 | 351 |
| | Inorganic filler loading amount (vol %) | | 30% | 20% | 60% | 30% |
| Organic solvent in varnish for forming die attach film | Kind of organic solvent | | Toluene | MIBK | Cyclo-pentanone | Toluene |
| | Amount of organic solvent (parts by mass) | | 90 | 130 | 135 | 90 |
| | Content of organic solvent in varnish (mass %) | | 20% | 20% | 20% | 20% |

TABLE 1-continued

| | | | | | |
|---|---|---|---|---|---|
| Die attach film drying conditions | Drying temperature | 130° C. | 130° C. | 130° C. | 130° C. |
| | Retention time (minutes) | 1.5 | 1.5 | 1.5 | 1.5 |
| | Intended film thickness (μm) | 80.0 | 80.0 | 80.0 | 80.0 |
| Film thickness T1 (μm) of application start portion | | 80.2 | 79.0 | 79.5 | 80.1 |
| Film thickness T2 (μm) of application end portion | | 80.9 | 81.2 | 81.1 | 80.5 |
| Amount of organic solvent (μg) per 1.0 g of die attach film | | 80.0 | 120.0 | 115.0 | 95 |
| Melt viscosity (Pa · s) of die attach film at 120° C. | | 2040 | 2040 | 770 | 10000 |
| Die attach performance evaluation | Voids | AA | AA | AA | AA |
| | Bleeding | A | A | A | AA |

TABLE 2

| | | | Comparative Example | | |
|---|---|---|---|---|---|
| | | | 1 | 2 | 3 |
| Die attach film composition (parts by mass) | Epoxy resin | EPPN-501H (Triphenylmethane-type epoxy resin) | 56 | 56 | 56 |
| | | YD-128 (Liquid bis A-type epoxy resin) | 49 | 49 | 49 |
| | Polymer component | YP-50 (Bis A-type phenoxy resin) | 30 | 30 | 30 |
| | | S-2060 (Acrylic resin) | | | |
| | Inorganic filler | AO502 (Alumina) | 205 | 205 | 205 |
| | S-510 (Epoxysilane-type silane coupling agent) | | 3.0 | 3.0 | 3.0 |
| | 2PHZ-PW (Imidazole-based curing agent) | | 8.5 | 8.5 | 8.5 |
| | Total solid content | | 351 | 351 | 351 |
| | Inorganic filler loading amount (vol %) | | 30% | 30% | 30% |
| Organic solvent in varnish for forming die attach film | Kind of organic solvent | | MEK | MEK | Cyclo-hexanone |
| | Amount of organic solvent | | 90 | 90 | 90 |
| | Content (mass %) of organic solvent in varnish | | 20% | 20% | 20% |
| Drying conditions | Drying temperature | | 130° C. | 130° C. | 130° C. |
| | Retention time (minutes) | | 1.5 | 1.5 | 1.5 |
| | Intended film thickness (μm) | | 5.0 | 80.0 | 5.0 |
| Film thickness T1 (μm) of application start portion | | | 5.0 | 80.1 | 5.0 |
| Film thickness T2 (μm) of application end portion | | | 7.2 | 88.6 | 5.0 |
| Amount of organic solvent (μg) per 1.0 g of die attach film | | | 1.0 | 6.0 | 810.0 |
| Melt viscosity (Pa · s) of die attach film at 120° C. | | | 6900 | 6900 | 7100 |
| Die attach performance evaluation | Voids | | C | B | C |
| | Bleeding | | AA | D | AA |

| | | | Comparative Example | | |
|---|---|---|---|---|---|
| | | | 4 | 5 | 6 |
| Die attach film composition (parts by mass) | Epoxy resin | EPPN-501H (Triphenylmethane-type epoxy resin) | 56 | 56 | 56 |
| | | YD-128 (Liquid bis A-type epoxy resin) | 49 | 49 | 49 |
| | Polymer component | YP-50 (Bis A-type phenoxy resin) | 30 | 30 | 30 |
| | | S-2060 (Acrylic resin) | | | |
| | Inorganic filler | AO502 (Alumina) | 205 | 205 | 205 |
| | S-510 (Epoxysilane-type silane coupling agent) | | 3.0 | 3.0 | 3.0 |
| | 2PHZ-PW (Imidazole-based curing agent) | | 8.5 | 8.5 | 8.5 |
| | Total solid content | | 351 | 351 | 351 |

TABLE 2-continued

| | | | | |
|---|---|---|---|---|
| | Inorganic filler loading amount (vol %) | 30% | 30% | 30% |
| Organic solvent in varnish for forming die attach film | Kind of organic solvent | Cyclo-hexanone | Cyclo-hexanone | MIBK |
| | Amount of organic solvent | 90 | 90 | 90 |
| | Content (mass %) of organic solvent in varnish | 20% | 20% | 20% |
| Drying conditions | Drying temperature | 130° C. | 160° C. | 130° C. |
| | Retention time (minutes) | 1.5 | 1.5 | 0.3 |
| | Intended film thickness (μm) | 80.0 | 80.0 | 80.0 |
| Film thickness T1 (μm) of application start portion | | 80.0 | 80.0 | 80.0 |
| Film thickness T2 (μm) of application end portion | | 80.1 | 80.3 | 82.1 |
| Amount of organic solvent (μg) per 1.0 g of die attach film | | 3210.0 | 1150.0 | 950.0 |
| Melt viscosity (Pa · s) of die attach film at 120° C. | | 7000 | 6900 | 7050 |
| Die attach performance evaluation | Voids | D | C | C |
| | Bleeding | AA | AA | B |

The boiling point (at 1 atm) and vapor pressure (at 25° C.) of organic solvent species described in each of the above tables are shown below.

MIBK: boiling point of 116° C., vapor pressure of 15.8 mmHg

Cyclopentanone: boiling point of 130° C., vapor pressure of 11.0 mmHg

Toluene: boiling point of 111° C., vapor pressure of 28.6 mmHg

MEK: boiling point of 80° C., vapor pressure of 78.0 mmHg

Cyclohexanone: boiling point of 156° C., vapor pressure of 4.3 mmHg

The above results show the following.

When an organic solvent having a boiling point lower than and a vapor pressure higher than those specified in the present invention was used as a medium of the varnish for forming a die attach film, the thickness of the obtained film was clearly increased at the application end portion when compared at the application start portion (Comparative Example 1). The dicing die attach film of Comparative Example 1 had a small amount of solvent remaining in the die attach film, but voids were likely to be generated in the die attach step when the die attach film at the application end portion was used as the die attach film. As a cause of this, it is considered that the component concentration in the varnish becomes uneven as MEK evaporates at the application end portion, and as a result, the surface smoothness of the die attach film is impaired.

In addition, even when the film thickness was set to 80 μm with the same varnish composition (using MEK) as in Comparative Example 1, a phenomenon was observed in which the film thickness was obviously increased at the application end portion when compared at the application start portion (Comparative Example 2). The dicing die attach film of Comparative Example 2 had a small amount of solvent remaining in the die attach film, but bleeding due to the film thickness increase was highly frequently observed when the die attach film at the application end portion was used as the die attach film. In addition, voids were suppressed as compared with Comparative Example 1 because of the large thickness, but voids were still observed at a certain frequency.

When an organic solvent having a boiling point higher than and a vapor pressure higher than those specified in the present invention was used as a medium of the varnish for forming a die attach film, the thickness of the die attach film became much more accurate (Comparative Examples 3 to 5). However, even when the thickness of the die attach film was set small, it was difficult to remove the organic solvent in the die attach film by drying, and voids resulting from the residual solvent were generated during thermocompression bonding (Comparative Example 3). This tendency was more remarkable as the thickness of the die attach film was increased (Comparative Example 4). In Comparative Example 5, the drying temperature was increased to 160° C., but the amount of the residual organic solvent was unable to be reduced to a desired level. Note that in the case of drying at 160° C., there is a possibility that a curing reaction of the die attach film occurs to a certain extent, and from this viewpoint, the drying procedure in Comparative Example 5 is not practical.

Even when the organic solvent defined in the present invention is used as a medium of the varnish for forming a die attach film, if the drying is insufficient, the amount of organic solvent remaining in the film still increases, and voids resulting from the residual solvent are generated at the time of thermocompression bonding (Comparative Example 6).

The dicing die attach film of each of Examples 1 to 8 satisfying the specifications of the present invention is compared to the above respective Comparative Examples. Here, the solvent was able to be sufficiently removed in a short time by gentle heating while increasing the thickness accuracy of the die attach film during formation of the die attach film. As a result, it was possible to prevent both voids caused by a residual solvent and voids caused by a decrease in surface smoothness in the die attach step, and to effectively prevent bleeding.

The present invention has been described as related to the present embodiments. It is our intention that the present invention not be limited by any of the details of the description unless otherwise specified, but rather be construed broadly within its spirit and scope as set out in the attached claims.

DESCRIPTION OF SYMBOLS

1 Semiconductor wafer
2 Die attach film (Bonding agent layer)
3 Dicing film
4 Semiconductor chip
5 Semiconductor chip with bonding agent layer
6 Circuit board
7 Bonding wire
8 Sealing resin
9 Semiconductor package

The invention claimed is:

1. A dicing die attach film, comprising:

a dicing film, and a die attach film stacked on the dicing film, wherein the die attach film comprises an organic solvent having a boiling point of 100° C. or more and less than 150° C. and a vapor pressure of 50 mmHg or less, and wherein an amount of the organic solvent in the die attach film satisfies the following (a):

(a) when 1.0 g of the die attach film is immersed in 10.0 mL of acetone at 4° C. for 24 hours, an amount of the organic solvent extracted into the acetone is 800 μg or less, wherein the die attach film further comprises:

an epoxy resin (A), an epoxy resin curing agent (B), a polymer component (C) comprising at least one of phenoxy resin and (meth)acrylic resin, and an inorganic filler (D), and wherein when the die attach film is heated at a temperature rising rate of 5° C./min from 25° C., a melt viscosity of the die attach film at 120° C. reaches a range of 500 to 10,000 Pa·s.

2. The dicing die attach film according to claim 1, wherein the organic solvent has a boiling point of 103 to 135° C. and a vapor pressure of 3.0 to 35.0 mmHg.

3. The dicing die attach film according to claim 2, wherein the amount of the organic solvent extracted into the acetone in the above (a) is 400 μg or less.

4. The dicing die attach film according to claim 1, wherein the dicing film is energy ray-curable.

5. A semiconductor package, comprising:

a semiconductor chip and a circuit board which are bonded to each other with a thermally cured product of a bonding agent, and/or semiconductor chips which are bonded to each other with a thermally cured product of a bonding agent, wherein the bonding agent is derived from the die attach film of the dicing die attach film according to claim 1.

6. The dicing die attach film according to claim 1, wherein the organic solvent comprises at least one of methyl isobutyl ketone, cyclopentanone, propylene glycol 1-monomethyl ether 2-acetate, diethyl ketone, butyl acetate, and diethyl carbonate.

7. The dicing die attach film according to claim 1, wherein the organic solvent comprises at least one of methyl isobutyl ketone, cyclopentanone, diethyl ketone, butyl acetate, and diethyl carbonate.

8. The dicing die attach film according to claim 1, wherein the organic solvent comprises at least one of methyl isobutyl ketone, cyclopentanone, toluene, propylene glycol 1-monomethyl ether 2-acetate, diethyl ketone, butyl acetate, and diethyl carbonate.

* * * * *